(12) United States Patent
Deml

(10) Patent No.: US 6,795,341 B2
(45) Date of Patent: Sep. 21, 2004

(54) CIRCUIT ARRANGEMENT FOR THE STORAGE OF DIGITAL DATA

(75) Inventor: Christoph Deml, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/172,108

(22) Filed: Jun. 14, 2002

(65) Prior Publication Data

US 2003/0009646 A1 Jan. 9, 2003

(30) Foreign Application Priority Data

Jun. 15, 2001 (DE) .......................................... 101 28 903

(51) Int. Cl.$^7$ .............................................. G11C 16/06
(52) U.S. Cl. ................ 365/185.09; 365/51; 365/189.01
(58) Field of Search ............................. 365/51, 52, 63, 365/185.09, 185.33, 185.21, 185.18, 185.28, 189.01, 201

(56) References Cited

U.S. PATENT DOCUMENTS

| | | | | |
|---|---|---|---|---|
| 5,509,134 A | * | 4/1996 | Fandrich et al. ............. | 515/430 |
| 5,604,702 A | * | 2/1997 | Tailliet ........................ | 365/200 |
| 5,784,705 A | * | 7/1998 | Leung ......................... | 711/169 |
| 5,986,918 A | * | 11/1999 | Lee ............................. | 365/103 |
| 5,996,108 A | * | 11/1999 | Tanzawa et al. ............ | 714/773 |
| 6,222,762 B1 | * | 4/2001 | Guterman et al. ......... | 305/185.03 |
| 6,317,364 B1 | * | 11/2001 | Guterman et al. ......... | 365/185.28 |
| 6,349,059 B1 | * | 2/2002 | Bartoli et al. ........... | 365/185.12 |
| 2002/0013876 A1 | * | 1/2002 | Rosa ............................. | 711/1 |

* cited by examiner

*Primary Examiner*—Gene N. Auduong
(74) *Attorney, Agent, or Firm*—Holme Roberts & Owen LLP

(57) ABSTRACT

In order to make memories more secure against interference occurring in operation, error correction devices are normally associated with them. If the memory contents of the storage location (1) are accessed by evaluating the location current, the problem arises that the location current is both value-continuous and time-continuous. If leakage currents occur in the storage location (1) that lead to an increased storage location current, then the current sensor amplifier (2) can fall below these values only with a constantly increasing access time between the values 0 and 1. When leakage currents occur the current sensor amplifier (2) for evaluating the location current may therefore switch over at arbitrary times. In order to be able to effect correctly a series-connected error correction in an error correction device (5), in each case registers (3) are interconnected between the current sensor amplifiers (2) and the error correction device (5) that intermediately store at a specific time ($t_4$) the output signal of the current sensor amplifier (2). Accordingly a switching over of the input signal of the error correction device (5), which in certain circumstances could lead to an erroneous error correction, can be avoided during the error correction.

6 Claims, 1 Drawing Sheet

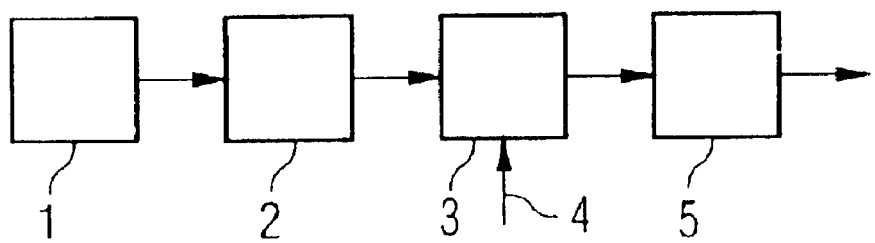
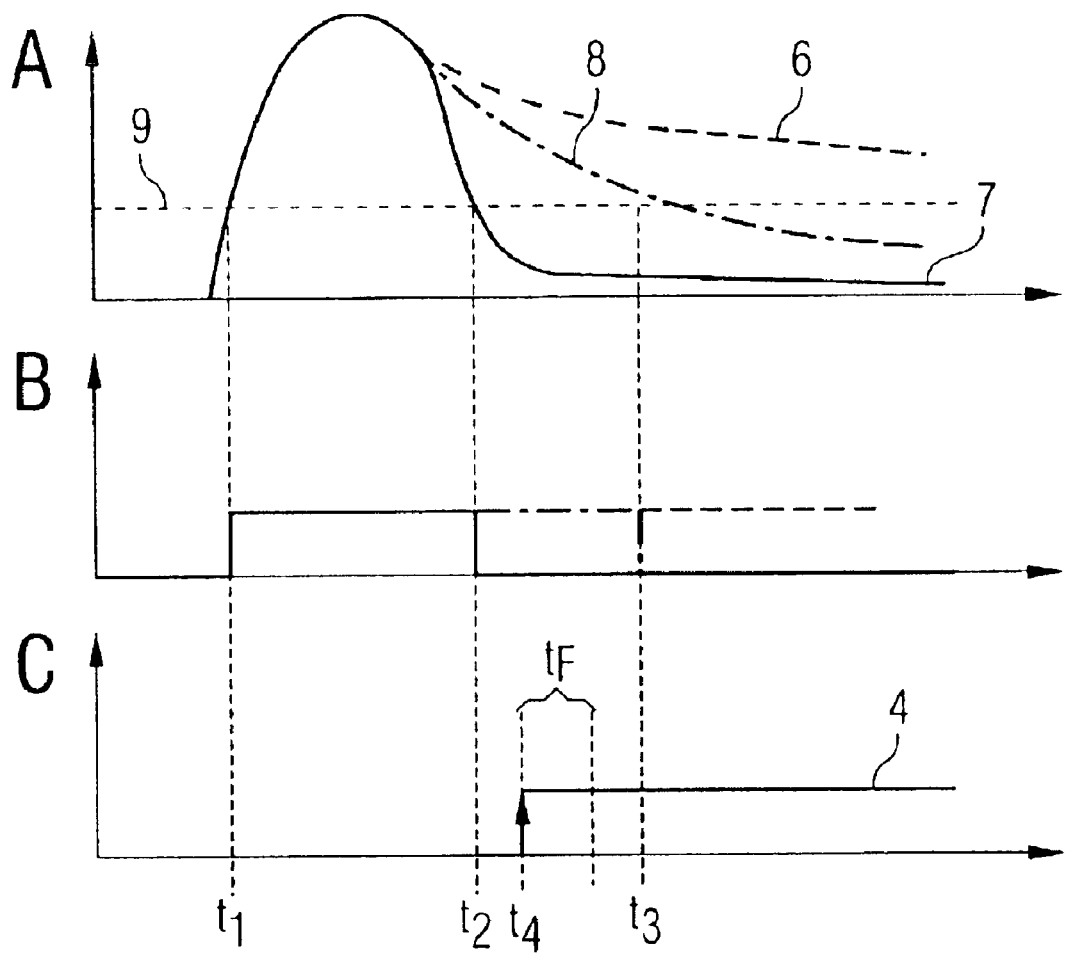

CIRCUIT ARRANGEMENT FOR THE STORAGE OF DIGITAL DATA

CROSS-REFERENCE TO RELATED APPLICATIONS

The present application claims priority from German patent application Serial Number DE 101 28 903.0 filed Jun. 14, 2001 and entitled "Circuit Arrangement for the Storage of Digital Data" which application is incorporated herein by reference in its entirety.

BACKGROUND OF THE INVENTION

The Field of the Invention

The present invention relates to a circuit arrangement with an error correction device for the storage of digital data, in which the data to be stored are stored in storage locations or storage cells from which the stored data can be read by means of a read amplifier by collecting an electrical characteristic.

BRIEF SUMMARY OF THE INVENTION

With such a storage circuit several states can be stored in each storage location, for example a 1 information and a 0 information. Depending on the state that is stored in each case a storage location, in which the stored information is read with the aid of a current sensor amplifier, supplies two different, defined currents when reading. These defined currents are however achieved only after a specific time, after which a displacement current required to read the storage locations has decayed. If a storage location is read, then on account of the displacement current required for the reading the location current rises to a specific value and then falls depending on the state stored in the location to one of the two defined currents, the location current corresponding to a 0 information being lower than the location current corresponding to a 1 information. Similarly, the read amplifier may also collect a characteristic other than the current, such as for example a voltage and/or an electrical resistance.

The collected electrical characteristic during the reading process is accordingly value-continuous as well as time-continuous. In order to be able to obtain the stored digital datum from the location current the said location current is compared by means of a current sensor amplifier to a reference current, the output of the current sensor amplifier adopting a high value if the location current is less than the reference current, and adopting a low value as soon as the location current is less than the reference current. In order to evaluate the location current the displacement current must however first of all be allowed to decay.

The series-connected error correction device, being a processing device, receives at its input side the stored data from several storage locations and generates therefrom an error-corrected output signal. For the error correction the data may be redundantly stored in a manner that enables the correct data to be reconstructed also in the case of erroneous individual bits.

With storage locations that are read with a current sensor amplifier the curves describing the location currents can change in particular on account of leakage currents. Due to leakage currents electrical charges may flow in storage locations, with the result that the employed voltages of the transistors used for reading the storage locations and thus also the location current occurring during the reading may change. In particular it may happen that the location currents corresponding to the various items of information are increased. As a result the location current after the decay of the displacement current falls to in each case higher values and moreover falls more slowly. In the case of a stored 0 information the time may therefore be extended arbitrarily, following which the location current falls below the reference current. If leakage currents arise in the circuit arrangement, after the beginning of the reading of the storage locations the current sensor amplifier may switch over at an unspecified time. Since the individual current sensor amplifiers do not necessarily switch over at the same time and also switch over at unspecified times, defective corrections may arise with a series-connected error correction device if for example the switching-over of the current sensor amplifiers has not been completed early enough. In this case insufficient time remains between the last switching-over of a current sensor amplifier and a time at which the output signal of the error correction device is collected and/or intermediately stored, in order to carry out the error correction in the error correction device.

The object of the present invention is accordingly to provide a circuit arrangement for the storage of digital data of the type mentioned in the introduction in which the error security can be increased, especially also in the event of storage location leakage currents.

This object is achieved according to the invention by a circuit arrangement having the features of claim 1.

Due to the interconnection of a register between the read amplifier and/or a current sensor amplifier and the processing device, in particular an error correction device, a signal that is both value-discrete as well as time-discrete is present at the input of the processing device. In this way during the processing of the data and/or during the error correction procedure the input signal of the error correction device can therefore be prevented from altering and leading to errors in the error correction. If a perturbed storage current occurs in one or more storage locations, in which the location current does not reach the correct value within the course of the reading procedure, then although a false state of the storage locations is intermediately stored by the register, nevertheless this can be corrected by the error correction device provided that not too many storage locations have been incorrectly read.

The registers may in this connection be controlled so that they intermediately store the output signal of the current sensor amplifier a specific time after the beginning of the reading procedure. This time period is adjusted so that the displacement currents have decayed. If however as a result of leakage currents the location currents are raised, the location current corresponding to the 0 information do not fall below the reference current.

In order to effect a correct adjustment of the register a control device may be associated with the circuit arrangement that controls the register a specific time after the start of the reading process in such a way that it can intermediately store the output signal of the current sensor amplifier.

The present invention may be used particularly advantageously with EEPROM memories, in which the danger of increased location currents is relatively great. The invention may be used especially with EEPROM memories that employ Fowler-Nordheim tunnels for programming and cancelling. In order in such cases to work with a low voltage a thin layer of tunnel oxide is as a rule used, whereby in turn the probability of a statistically accidentally occurring leakage current path in a storage location greatly increases. This is also termed "moving bit".

BRIEF DESCRIPTION OF THE DRAWINGS

The invention is described in more detail hereinafter with the aid of a preferred embodiment and with reference to the accompanying drawings, in which:

FIG. 1 shows the block diagram of a storage site of a circuit arrangement according to the invention, and FIG. 2 shows the curves corresponding to the storage location current, output signal of the current sensor amplifier and control of the register.

FIG. 1 shows part of a circuit arrangement according to the invention which comprises a storage location 1 to 3 as well as an error correction device 5. The storage location 1 to 3 serves to store a bit, while the error correction device 5 comprises further inputs and output (not shown) in order to be able to carry out an error correction using the stored bits from several storage locations.

The storage site has a storage location 1 in which the information is stored in the form of a charge on a floating gate. The charge stored in the storage location 1 and/or the information stored in the storage location 1 is read with the aid of a current sensor amplifier 2 that during a reading procedure determines the location current and emits a high signal at the output when the location current exceeds a specific value, and emits a low signal when the location current drops below this value.

The reading procedure is controlled by a control device (not shown) in which at the start of the reading procedure a relatively high displacement current exists for reading the contents of the storage location 1 and the information can be determined only after the decay of this displacement current.

A register 3 is connected to the output of the current sensor amplifier 2, which intermediately stores the output signal of the current sensor amplifier 2 as soon as the register 3 is controlled by means of a control signal 4. The register 3 is signal edge-controlled so that, with a positive edge of the current signal 4 it intermediately stores the output signal of the current sensor amplifier 2 present at the input, with the result that it is present unchanged at the output of the register 3. The output of the register 3 is connected to an input of the error correction device 5.

Various currents and/or signals of the reading procedure of the storage location 1 occurring in the circuit are described hereinafter on the basis of the curves shown in FIG. 2. Diagram A shows the curve behaviour of the location current in the storage location 1, curve 6 showing the location current for a stored 1 information and curve 7 showing the location current for a stored 0 information with in each case correct current curves. Curve 8 in diagram A shows the behaviour of the location current with stored 0 information, whereby as a result of an error a leakage current occurs and the location current is increased. Furthermore diagram A shows a reference current 9 by means of which the current sensor amplifier 2 compares the location current of the storage location 1.

Diagram B shows the output signal of the current sensor amplifier 2 and diagram C shows the pulse signal 4 for controlling the register 3. Four points in time $t_1$ to $t_4$ are shown for all three diagrams A to C.

DETAILED DESCRIPTION OF THE PREFERRED EMBODIMENTS

At the start of the reading procedure the location current rises in the same way independently of the information stored in the storage location 1 since the current curve is determined by the displacement current that is required to read the contents of the storage location 1. As soon as the location current exceeds the reference current 9 the output of the current sensor amplifier 2 switches to "high", which is the case at time $t_1$ in the diagrams A, B. The location current curve in diagram A rises to a maximum value and then falls at different rates and to different values depending on the information stored in the storage location 1 and possible leakage currents in the storage location 1. If for example a 0 information is stored in the storage location 1 and no leakage current occurs, then the location current again falls below the reference current 9 at time $t_2$, as shown in curve 7, with the result that at this time the output of the current sensor amplifier 2 again switches to "low". From time $t_2$ onwards the correct signal thus occurs at the output of the current sensor amplifier 2. If on the other hand the storage locations 1 stores a 1 information and no leakage current occurs, then the location current remains above the reference current 9, as shown in curve 6, with the result that in this case the output signal of the current sensor amplifier 2 remain at the high level. The curve of the output signals of the current sensor amplifier 2 shown in diagram B are given in the same dotted line form as the various associated location current curves 6 to 8 in diagram A. For example, the current sensor amplifier output signal for the case of a stored 0 information is reproduced as a continuous line in the same way as the corresponding location current curve 7, whereas the current sensor amplifier output signal as well as the corresponding location current curve 6 for a stored 1 information are shown by dotted lines.

If now a leakage current occurs in the storage location 1, the location current increases with the result that, in the case of a stored 0 information as shown in curve 8, the location current falls away more slowly and to a higher value after the decay of the displacement current. The location current therefore falls below the reference current 9 at a later time $t_3$.

In order to be able to read the stored data from the circuit arrangement after a defined time, the register 3 is controlled by means of the control signal 4 at a specified time $t_4$ so that the signal present at the output of the current sensor amplifier 2 at this time is intermediately stored for the further processing in the error correction device 5. The error correction device 5 requires a certain time $t_F$ for the execution of the correction during which no valid data are present at the output of the error correction device 5. Valid data appear at the output of the error correction device 5 only after the time $t_4+t_F$.

If now the storage location 1 stores a 0 information and a leakage current occurs, then the curve 8 results, in which however the location current falls below the reference current 9 only at a later time $t_3$, with the result that at time $t_4$ a high signal is present at the output of the current sensor amplifier device 2 even though the storage location 1 stores a 0 information. This signal is, as described hereinbefore, constantly intermediately stored for processing in the error correction device 5 so that the error correction can be carried out correctly. Assuming that not too many storage locations 1 have been incorrectly read as a result of leakage currents, the correct data are accordingly present at the output of the error correction device 5 starting from time $t_4+t_F$. A switching over of the input signal of the error correction device 5 as a result of a delayed drop in the location current below the reference current 9 is thus excluded. With the aid of the register 3 the input signal of the error correction device 5 can be made both value-discrete and time-discrete and the error correction can be effected without interference.

What is claimed and desired to be secured by United States Letters Patent is:

1. A circuit arrangement for storage of digital data with storage sites, comprising:

a storage location;

a read amplifier for determining contents of the storage location by collecting an electric characteristic of the storage location;

a controllable register for intermediate storage of a signal state; and at least one processing device for further processing of data stored in the storage location, wherein an input of the controllable register is connected to an output of the read amplifier and an output of the controllable register is connected to an input of the processing device.

2. A circuit arrangement according to claim 1, wherein the processing device is an error correction device for correcting errors of data stored in the storage sites.

3. A circuit arrangement according to claim 1, wherein the read amplifier is a current sensor amplifier for collecting the storage location current.

4. A circuit arrangement according to claim 3, further comprising a control device that controls, by the current sensor amplifier, the controllable register of a storage site a specific time after start of a read procedure of the contents of the storage location, so that the controllable register intermediately stores an output signal of the current sensor amplifier.

5. A circuit arrangement according to claim 1, wherein the circuit arrangement is an EEPROM memory or a DRAM or SRAM memory.

6. A circuit arrangement according to claim 1, wherein the circuit arrangement is an EEPROM memory and has Fowler-Nordheim tunnels or channel hot electron tunnels.

* * * * *